United States Patent
Mitsui et al.

(10) Patent No.: US 7,130,063 B2
(45) Date of Patent: Oct. 31, 2006

(54) MICROPATTERN SHAPE MEASURING SYSTEM AND METHOD

(75) Inventors: Yasuhiro Mitsui, Fuchuu (JP);
Yasutsugu Usami, Tokyo (JP); Isao Kawata, Sayama (JP); Yuya Toyoshima, Tokyo (JP); Tadashi Otaka, Hitachinaka (JP); Nobuyuki Iriki, Kodaira (JP)

(73) Assignee: Hitachi High-Technologies Corporation, Tokyo (JP)

( * ) Notice: Subject to any disclaimer, the term of this patent is extended or adjusted under 35 U.S.C. 154(b) by 18 days.

(21) Appl. No.: 11/102,703

(22) Filed: Apr. 11, 2005

(65) Prior Publication Data
US 2005/0182595 A1 Aug. 18, 2005

Related U.S. Application Data

(63) Continuation of application No. 10/291,675, filed on Nov. 12, 2002, now Pat. No. 6,894,790.

(30) Foreign Application Priority Data
Nov. 13, 2001 (JP) ............................. 2001-346846

(51) Int. Cl.
*G01B 11/04* (2006.01)
(52) U.S. Cl. ........................ 356/636; 356/72; 356/337; 250/310
(58) Field of Classification Search .................. 356/72, 356/636, 337; 250/310
See application file for complete search history.

(56) References Cited

U.S. PATENT DOCUMENTS

| 5,422,723 | A | | 6/1995 | Paranjpe et al. |
| 5,585,211 | A | | 12/1996 | Firstein et al. |
| 5,607,800 | A | | 3/1997 | Ziger |
| 6,137,303 | A | * | 10/2000 | Deckert et al. ............. 324/765 |
| 6,317,211 | B1 | * | 11/2001 | Ausschnitt et al. ......... 356/401 |
| 6,407,373 | B1 | | 6/2002 | Dotan |
| 6,650,424 | B1 | | 11/2003 | Brill et al. |
| 6,809,809 | B1 | * | 10/2004 | Kinney et al. ........... 356/237.5 |

FOREIGN PATENT DOCUMENTS

| JP | 4-342942 | 11/1992 |
| JP | 8-255751 | 10/1996 |

* cited by examiner

Primary Examiner—Gregory J. Toatley, Jr.
Assistant Examiner—Kara Geisel
(74) Attorney, Agent, or Firm—Dickstein Shapiro LLP

(57) ABSTRACT

A test pattern formed in a scribe line area of a wafer is irradiated with a light beam to measure the width thereof; the test pattern is irradiated with an electron beam so as to measure the width thereof; an amount of change in the width of the test pattern is calculated; a dummy pattern having the same width as that of a semiconductor device of the wafer is irradiated with an electron beam to measure the width thereof; and the width of a pattern is estimated by the use of the calculated amount of width change so as to determine the shape of the pattern. Thus, a shape measuring system and method capable of determining the shape of a micropattern in a semiconductor device without changing the dimensions of the micropattern can be provided.

6 Claims, 3 Drawing Sheets

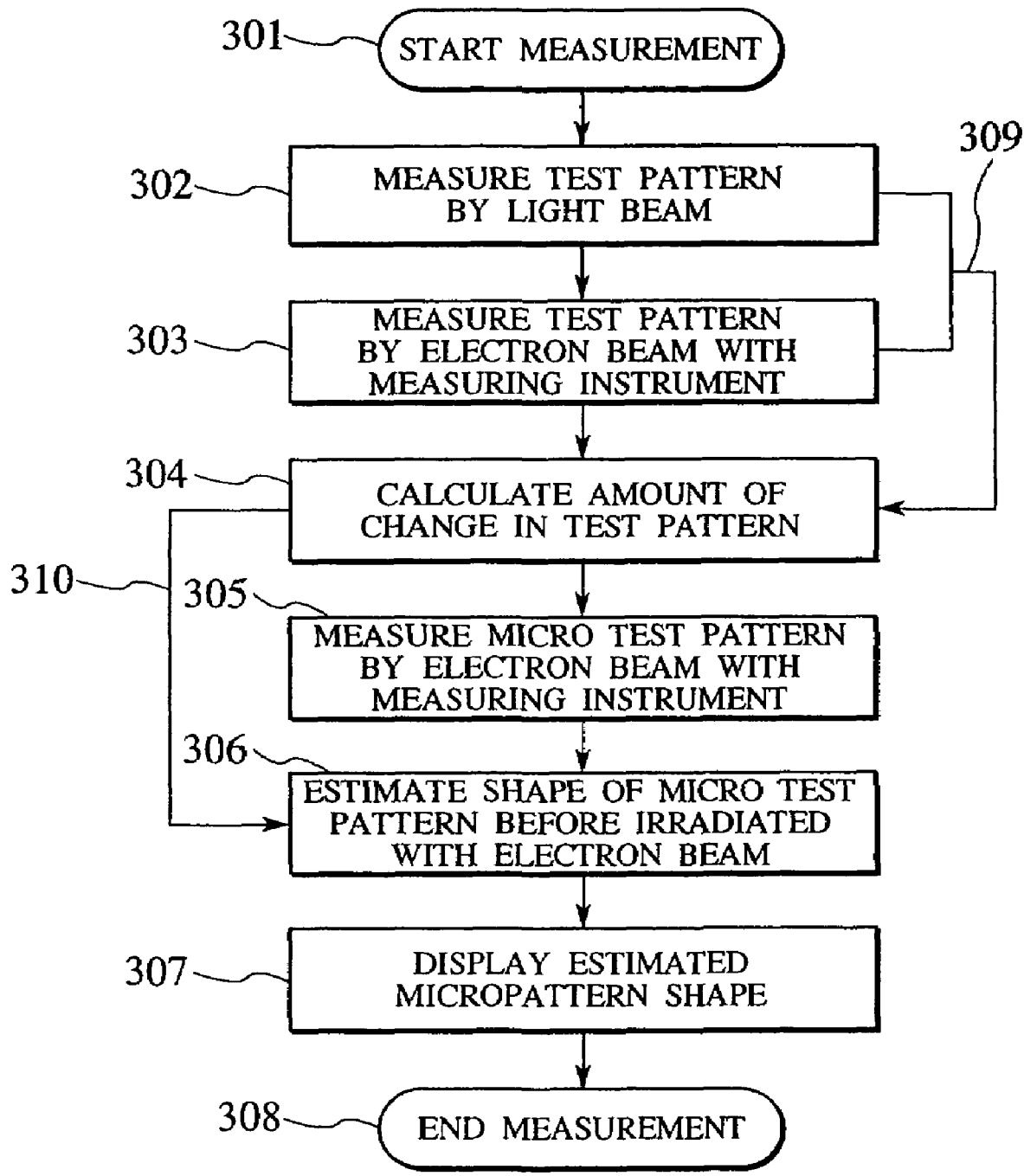

MICROPATTERN SHAPE MEASURING SYSTEM AND METHOD

CROSS-REFERENCE TO RELATED APPLICATION

This application is a continuation of U.S. patent application Ser. No. 10/291,675, filed on Nov. 12, 2002 now U.S. Pat. No. 6,894,790, the subject matter of which is incorporated in its entirety by reference herein.

BACKGROUND OF THE INVENTION

The present invention relates to a technique for measuring the shapes of micropatterns formed in semiconductor memories, integrated operational circuits and other semiconductor devices.

Aimed at achieving higher integrated semiconductor devices, wiring pattern width is remarkably becoming narrower. New resist materials are under development for use with ArF (argon fluoride)-based short-wavelength exposure light in order to form micropatterns, as described in Japanese Patent Laid-open No. 2000-241964. On the other hand, length-measuring SEM (Scanning Electron Microscopy) is known as a technique for measuring the width of a micropattern formed in a semiconductor device. The length measuring SEM emits an electron beam and uses the amplitude of a signal obtained by detecting generated secondary electrons and reflected electrons. One example application method is disclosed in Japanese Patent Laid-open No. 2001-272219.

Although the length-measuring SEM can measure a very small width, it has a problem that irradiating a resist pattern made of such a material as mentioned above with an electron beam results in making the width of the pattern smaller.

SUMMARY OF THE INVENTION

It is an object of the present invention to provide a shape measuring system and method capable of measuring the shape of a micropattern in a semiconductor device without changing the dimensions of the micropattern.

An embodiment of the present invention comprises a measuring mechanism emitting an electron beam and a measuring mechanism emitting a light beam, in which a test pattern place is provided in a scribe line area of a wafer formed to divide the wafer into a plurality of semiconductor devices, a plurality of patterns each having a plurality of widths measurable with the light beam are provided in the test pattern place by the same manufacture process as a pattern of the semiconductor device, and a dummy pattern having a width equal to that of the pattern of the semiconductor device is provided by the same manufacture process as the patterns in the semiconductor device. The width of the pattern of the semiconductor device is estimated by the following steps of: irradiating the plurality of patterns formed in the test pattern place with the light beam so as to measure the widths of the plurality of patterns; irradiating the plurality of patterns with the electron beam so as to measure the widths of the plurality of patterns; calculating an amount of change in the width of each of the plurality of patterns; irradiating the dummy pattern with the electron beam so as to measure the width of the dummy pattern; and from the measured width of the dummy pattern and the amount of width change, calculating the width which the dummy pattern should have had before the dummy pattern is irradiated with the electron beam.

BRIEF DESCRIPTION OF THE DRAWINGS

Other objects and advantages of the invention will become apparent from the following description of embodiments with reference to the accompanying drawings in which:

FIG. 3 is a flowchart indicating a procedure for pattern shape measurement.

DETAILED DESCRIPTION OF THE PREFERRED EMBODIMENTS

Figure 1:
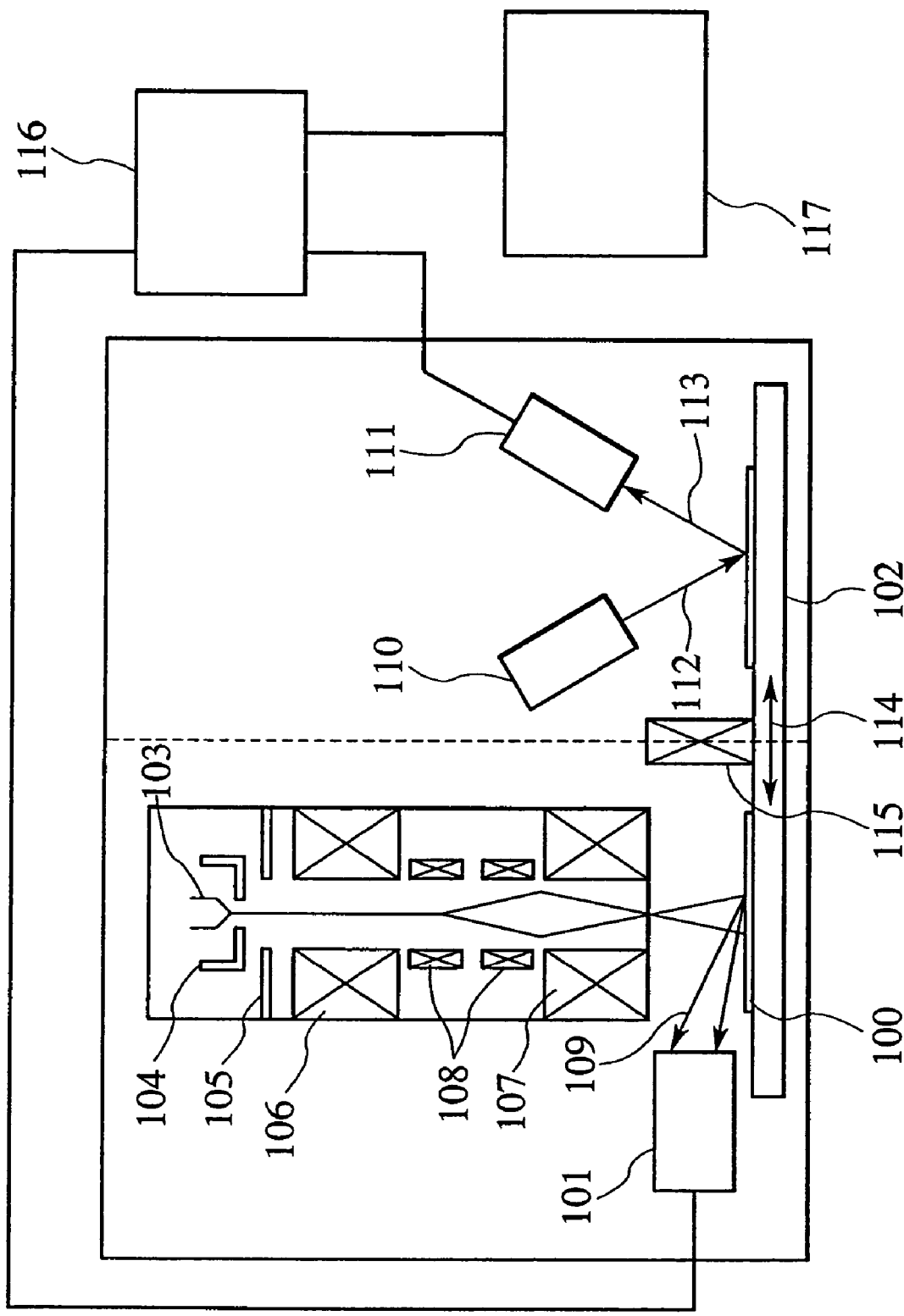
FIG. 1 is a longitudinal sectional view of a semiconductor device inspection apparatus.

Embodiments of the present invention will thereinafter be described with reference to the drawings. FIG. 1 is a longitudinal sectional view of a semiconductor device inspection apparatus in which the present invention is implemented.

This semiconductor device inspection apparatus consists of a part for irradiating a wafer 100 with an electron beam and a part for irradiating the wafer 100 with light. Mounted on a stage 102, the wafer 100 can go back and forth between the two parts. There is provided an interlock 115 between the two parts so that the part where an electron beam is directed to the wafer 100 is kept vacuum.

The part for irradiating the wafer with an electron beam consists mainly of: an electron source 103; an electron beam extraction electrode 104; an aperture 105 for shaping the electron beam; a condenser electromagnetic lens 106 and an objective electromagnetic lens 107 for converging the electron beam; and a deflector 108 for deflecting the electron beam so as to scan the wafer 100 and for turning the electron beam away from the wafer 100. Secondary electrons and reflected electrons 109, which are generated from the wafer 100 due to the scanning electron beam, are detected by a detector 101. An image signal is generated by an image processor 116 from the detected electrons. On a monitor 117, an image is displayed from the image signal.

Meanwhile, in the part for irradiating the wafer 100 with light, a light beam 112 generated from a light beam source 110 is directed to the wafer 100, light 113 is detected by a detector 111, an image signal is generated by the image processor 116 from the detected light and an image is displayed on the monitor 117 from the image signal.

As a light beam-used method for measuring the height of a pattern, such a scatterometric method as disclosed in Japanese Patent Laid-open No. 255751/1996 is known.

The following describes how the above-mentioned semiconductor device inspection apparatus is used to detect the shape of a micropattern.

Figure 2:
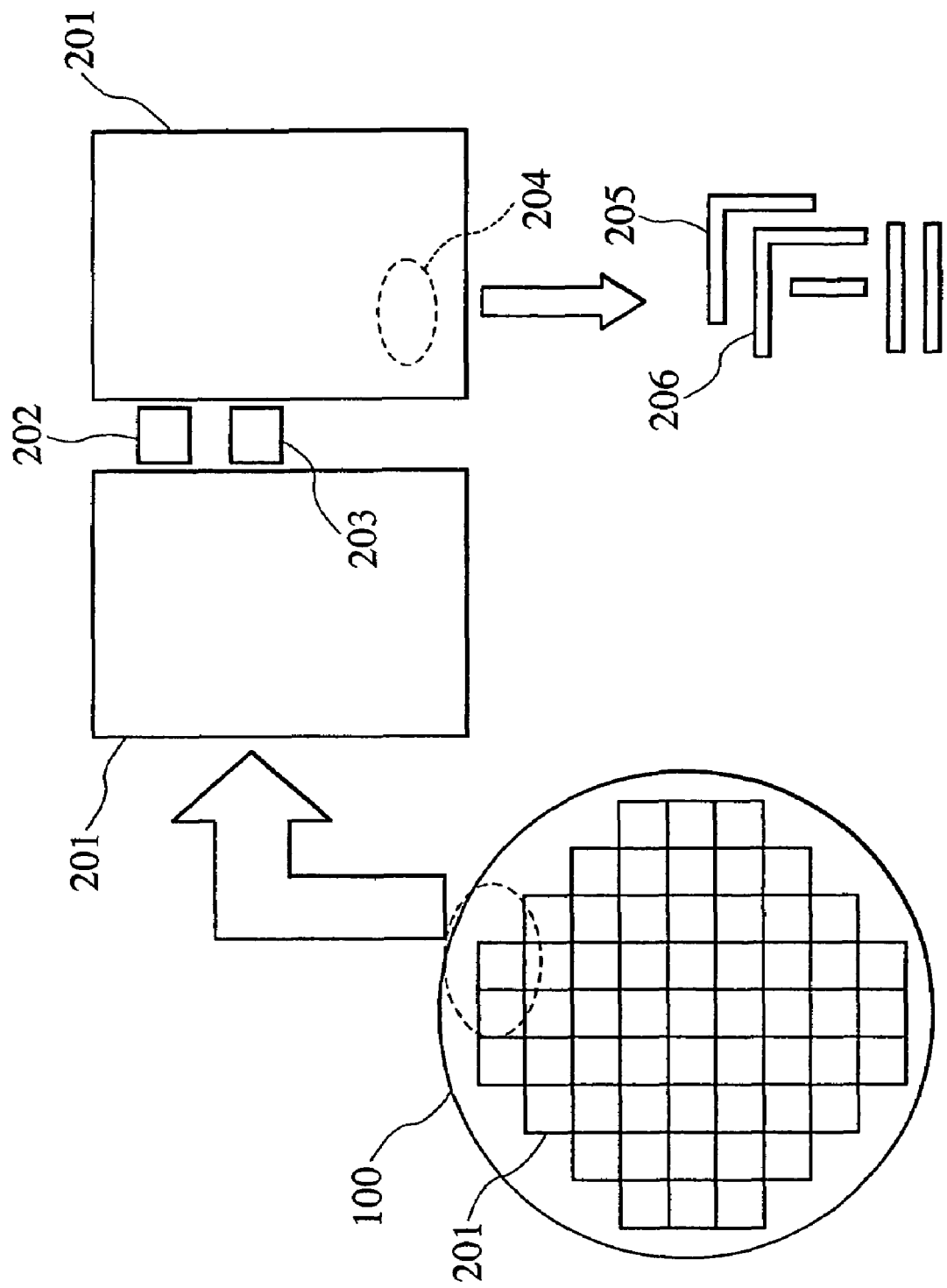
FIG. 2 shows top views of a wafer 100 and its small portion.

FIG. 2 shows top views of a wafer 100 and its small portion. A great number of semiconductor chips 201 are formed on the wafer 100. There is a scribe area between semiconductor chips 201 and cutting is done along the scribe area to finally produce separate semiconductor chips. In this scribe area, test pattern places 202 and 203 are located. Patterns in these places shall be formed by the same process as a representative pattern 206 in a major area 204 to be inspected in a semiconductor chip 201 and the dimensions, particularly widths, of the patterns shall be able to be measured by emitting a light beam.

In the major area 204 in the semiconductor chip 201, a dummy pattern 205 is formed together with the pattern 206.

The dummy pattern 205 shall be formed by the same manufacture process and have the same width as the pattern 206.

FIG. 3 is a flowchart indicating a procedure for pattern shape detection.

First, at step 302 in FIG. 3, the width of a pattern in the test pattern place 202 is measured with a light beam and stored in a memory. Further, another pattern having a different width in the test pattern place 202 or the other test pattern place 203 is measured likewise and the measured width is stored in the memory.

Then at step 303, an electron beam is directed to one of the patterns measured at step 302 to measure the width again. This width, that of the pattern after thinned by the directed electron beam, is stored in the memory. Likewise, the electron beam is directed to the other pattern measured at step 302 to measure the width again and the result is stored in the memory.

Then at step 304 in FIG. 3, as indicated by an arrow 309, the amount of width change caused by the directed electron beam is calculated from the data obtained with the light beam and the data obtained with the electron beam. The widths of the test patterns shall be such that they can be measured with the light beam. Practically, the value b/a, where a is the width data obtained with the light beam and b is the width data obtained with the electron beam, is calculated by a computer in the image processor 116 and stored in a memory (not shown in the figure) in the image processor 116.

Then at step 305, the electron beam is directed to the dummy pattern in the semiconductor chip 201 shown in FIG. 2 to measure its width c. This dummy pattern 205 shall be so thin as the representative pattern 206 that the width cannot be measured with the light beam.

Then at step 306, by using the result obtained at step 304 as indicated by an arrow 310, the width d which the dummy pattern 205 should have had before the electron beam is emitted is estimated. That is, by using the amount of width change b/a caused due to the emitted electron beam, stored in the memory at step 304, the width d can be calculated as d=c×(a/b). Although this width is an estimated width of the dummy pattern, it can be assumed as the width of the representative pattern 206 since the dummy pattern 205 is formed by the same process as the representative pattern 206 and the dummy pattern 205 before being irradiated with the electron beam should have had a width equal to that of the representative pattern 206.

Then at step 307, the estimated width or a pattern having the estimated width is displayed on the monitor 117.

As mentioned above, it is possible to determine the shape of a micropattern in a semiconductor device by: measuring the width of a test pattern formed in a scribe area of the wafer by the use of a light beam and an electron beam and storing the measured widths; calculating the amount of width change; measuring the width of a dummy pattern formed in the semiconductor chip with the electron beam; and estimating the width the dummy pattern should have had before the dummy pattern is irradiated with the electron beam.

Although in this embodiment, the test pattern formed in the scribe area is a line and space pattern consisting of a repeated combination of a long and narrow ridge and valley, any other patterns such as repeated holes can also be measured by the same concept.

As described so far, the present invention can provide a shape measuring system and method capable of determining the shape of a micropattern in a semiconductor device without changing the dimensions of the micropattern.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A micropattern shape measuring system comprising;
   an irradiating mechanism for irradiating a test pattern place in a scribe line area of a wafer formed to divide the wafer into a plurality of semiconductor devices with an electron beam;
   a detector for detecting charged particles from the wafer;
   a measuring unit for measuring first widths of a plurality of patterns formed in the test pattern place based on a signal from the detector;
   a storage unit for communicating with a measuring mechanism and storing first widths and second widths, the measuring mechanism measuring the second widths of the plurality of patterns formed in the test pattern place and being obtained by irradiating the plurality of patterns with a light beam; and
   a calculating unit for calculating first amount of change between the first widths and the second widths and sending the first amount of change to the storage unit;
   wherein the irradiating mechanism irradiates a dummy pattern formed in a semiconductor device in the wafer with the electron beam, the detector detects charged particles from the wafer, the measuring unit measures a third width of the dummy pattern based on a signal from the detector, the storage unit stores the third width of the dummy pattern, the calculating unit estimates a fourth width of the dummy pattern based on the stored first and second widths and third width in the storage unit, and a display unit displays the fourth width of the dummy pattern.

2. The micropattern shape measuring system according to claim 1, wherein the first widths are measured from a plurality of the test pattern places in the scribe line area of the wafer.

3. The micropattern shape measuring system according to claim 1, wherein the second widths are measured from a plurality of the test pattern places in the scribe line area of the wafer.

4. A micropattern shape measuring method comprising the steps of:
   (a) irradiating a test pattern place in a scribe line area of a wafer formed to divide the wafer into a plurality of semiconductor devices with a light beam;
   (b) detecting a reflecting light from the wafer by a sensor;
   (c) measuring first widths of a plurality of patterns formed in the test pattern place based on a signal from the sensor;
   (d) storing the first widths in a storage unit;
   (e) irradiating the test pattern place with an electron beam;
   (f) detecting charged particles from the wafer by a detector;
   (g) measuring second widths of the plurality of patterns based on a signal from the detector;
   (h) storing the second widths in the storage unit;
   (i) calculating a first amount of change between the first widths and the second widths;
   (j) storing the first amount of change in the storage unit;

(k) irradiating a dummy pattern formed in a semiconductor device in the wafer with the electron beam;
(l) detecting charged particles from the wafer by the detector;
(m) measuring a third width of the dummy pattern based on a signal from the detector;
(n) storing the third width of the dummy pattern in the storage unit;
(o) estimating a fourth width of the dummy pattern based on the stored first and second widths and third width in the storage unit, wherein the fourth width is a value before step (k); and
(p) displaying the fourth width of the dummy pattern on a display unit.

5. The micropattern shape measuring method according to claim 4, wherein the first widths are measured from a plurality of the test pattern places in the scribe line area of the wafer.

6. The micropattern shape measuring method according to claim 4, wherein the second widths are measured from a plurality of the test pattern places in the scribe line area of the wafer.

* * * * *